(12) United States Patent
Zhang et al.

(10) Patent No.: US 11,700,701 B2
(45) Date of Patent: Jul. 11, 2023

(54) DISPLAY APPARATUS

(71) Applicant: BOE Technology Group Co., Ltd., Beijing (CN)

(72) Inventors: Yao Zhang, Beijing (CN); Guoshuai Zhu, Beijing (CN); Jinghua Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/505,489

(22) Filed: Oct. 19, 2021

(65) Prior Publication Data
US 2022/0217860 A1 Jul. 7, 2022

(30) Foreign Application Priority Data
Jan. 5, 2021 (CN) .......................... 202120018212.8

(51) Int. Cl.
H05K 5/02 (2006.01)
H05K 5/00 (2006.01)
F16M 11/06 (2006.01)
F16M 11/22 (2006.01)
G09F 9/30 (2006.01)

(52) U.S. Cl.
CPC .......... *H05K 5/0234* (2013.01); *F16M 11/06* (2013.01); *F16M 11/22* (2013.01); *G09F 9/30* (2013.01); *H05K 5/0017* (2013.01); *F16M 2200/08* (2013.01)

(58) Field of Classification Search
None
See application file for complete search history.

(56) References Cited

U.S. PATENT DOCUMENTS

| | | | | |
|---|---|---|---|---|
| 7,808,779 | B2 * | 10/2010 | Lum | G06F 1/1632 439/55 |
| 7,810,222 | B2 * | 10/2010 | Ward | H01R 35/02 29/445 |
| 7,864,262 | B2 * | 1/2011 | Chen | F16M 11/18 349/60 |
| 7,889,494 | B2 * | 2/2011 | Stampfli | H04B 1/3888 224/663 |
| 8,177,178 | B2 * | 5/2012 | Carnevali | F16M 11/2078 248/223.41 |
| 8,422,206 | B2 * | 4/2013 | Fu | F16M 13/00 361/679.01 |

(Continued)

*Primary Examiner* — Xanthia C Cunningham
(74) *Attorney, Agent, or Firm* — IPro, PLLC

(57) ABSTRACT

The present disclosure relates to the field of display technologies, and provides a display apparatus, including: a support and a display module, wherein the support includes a support part and a rotation part; a frame is disposed at a periphery of the display module, and includes two first frame segments which are oppositely arranged and two second frame segments which are oppositely arranged; one end of the rotation part is pivoted to the support part; a rotation axis of the rotation part is a center line of the rotation part; the other end of the rotation part is fixedly connected to any one of the first frame segments or the second frame segments; the axis of the rotation part is at a first included angle with the frame; and the first included angle is used for switching of the display module between a landscape-screen mode and a portrait-screen mode.

18 Claims, 10 Drawing Sheets

(56) References Cited

U.S. PATENT DOCUMENTS

| | | | | |
|---|---|---|---|---|
| 8,550,343 | B2* | 10/2013 | Ko | G07G 1/0018 235/383 |
| 8,605,429 | B2* | 12/2013 | Shen | G06F 1/181 361/679.55 |
| 8,780,548 | B2* | 7/2014 | Lee | G06F 1/1616 361/679.44 |
| 8,811,007 | B2* | 8/2014 | Zhou | H04M 1/04 361/679.55 |
| 8,867,202 | B2* | 10/2014 | Williams | G06F 1/1632 361/679.41 |
| 9,060,416 | B2* | 6/2015 | Supran | H05K 7/00 |
| 9,207,714 | B2* | 12/2015 | Boomhour | H04M 1/04 |
| 9,310,840 | B2* | 4/2016 | Beatty | H04M 1/04 |
| 9,470,358 | B2* | 10/2016 | Le Gette | F16M 13/00 |
| D788,113 | S* | 5/2017 | Watanabe | D14/434 |
| 9,680,253 | B2* | 6/2017 | Mehandjiysky | G06F 1/1632 |
| 9,731,600 | B1* | 8/2017 | White | B60K 35/00 |
| 10,013,031 | B2* | 7/2018 | Knepper | G06F 1/1618 |
| 10,034,399 | B2* | 7/2018 | Shin | H05K 5/0226 |
| 10,228,727 | B1* | 3/2019 | Pickett | A45F 5/00 |
| 11,293,585 | B2* | 4/2022 | Li | F16M 11/04 |
| 2003/0042385 | A1* | 3/2003 | Hung | F16C 11/086 248/371 |
| 2005/0146847 | A1* | 7/2005 | Hara | G06F 1/1616 361/679.08 |
| 2009/0166482 | A1* | 7/2009 | Gan | H05K 5/0017 248/122.1 |
| 2010/0200719 | A1* | 8/2010 | Ehrman | B60R 11/02 29/897.3 |
| 2013/0088830 | A1* | 4/2013 | Lim | G06F 1/1632 361/679.43 |
| 2013/0187020 | A1* | 7/2013 | Trotsky | F16M 13/022 248/309.3 |
| 2014/0014790 | A1* | 1/2014 | White | F16M 11/041 248/122.1 |
| 2016/0037665 | A1* | 2/2016 | Zhang | F16M 11/10 248/371 |
| 2016/0294113 | A1* | 10/2016 | Mehandjiysky | G06F 1/26 |
| 2019/0072229 | A1* | 3/2019 | Sherman | F16M 11/2028 |

* cited by examiner

DISPLAY APPARATUS

CROSS-REFERENCE TO RELATED APPLICATION

This application claims priority to Chinese Patent Application No. 202120018212.8, filed on Jan. 5, 2021 and entitled "DISPLAY APPARATUS", the entire content of which is incorporated herein by reference

TECHNICAL FIELD

The present disclosure relates to the field of display technologies, and in particular to a display apparatus.

BACKGROUND

A digital signage refers to a multimedia professional audio-visual system, which releases commercial, financial and entertainment information through a large-screen terminal display device in large shopping malls, supermarkets, hotel lobbies, restaurants, cinemas and other public places where people gather. At present, there are two forms of common digital signages in the market: landscape-screen digital signages and portrait-screen digital signages. In addition, there are two types of digital signages: a single-sided digital signage with one screen for single-sided display and a double-sided digital signage with two screens that are arranged back to back and that are used for double-sided display.

SUMMARY

Embodiments of the present disclosure provide a display apparatus.

An embodiment of the present disclosure provides a display apparatus. The display apparatus includes a support and a display module, wherein a frame is disposed at a periphery of the display module; the frame includes two first frame segments which are oppositely arranged and two second frame segments which are oppositely arranged; the support includes a support part and a rotation part; one end of the rotation part is pivoted to the support part; a rotation axis of the rotation part is a center line of the rotation part; the other end of the rotation part is fixedly connected to any one of the first frame segments and the second frame segments; the axis of the rotation part is at a first included angle with a frame segment connected to the the rotation part; and the first included angle is used for switching of the display module between a landscape-screen mode and a portrait-screen mode.

Optionally, the support part includes a base and a support sleeve, wherein one end of the support sleeve is fixedly connected to the base; the rotation part includes a movable sleeve; one end of the movable sleeve is pivoted to the other end of the support sleeve; and the other end of the movable sleeve is fixedly connected to the frame of the display module.

Optionally, the support sleeve includes a vertical segment and a transition segment, wherein the vertical segment is perpendicularly connected to the base; the transition segment is fixedly connected to the vertical segment and pivoted to the movable sleeve; an axis of the transition segment is at a second included angle with an axis of the vertical segment; and the second included angle ranges from 130 degrees to 140 degrees.

Optionally, a drive motor is provided in the movable sleeve, wherein a rotation shaft of the drive motor is fixedly connected to the transition segment; a housing of the drive motor is coaxial with the movable sleeve; an annular space is provided between the housing of the drive motor and the movable sleeve; and the housing of the drive motor is fixedly connected to one end of the movable sleeve.

Optionally, an elbow end cap is provided in the transition segment of the support sleeve, wherein the elbow end cap is fixedly connected to an inside wall of the transition segment; and the rotation shaft of the drive motor penetrates through the end of the movable sleeve and is fixedly connected to the elbow end cap.

Optionally, the support part further includes a tightening sleeve, wherein one end of the tightening sleeve is oppositely connected the transition segment; the other end of the tightening sleeve is sleeved on an outside of the movable sleeve; a locating bearing and a cupped rotation shaft are provided in the tightening sleeve; the cupped rotation shaft is fitted with an inner ring of the locating bearing; one end of the cupped rotation shaft is fixedly connected to the elbow end cap; and the other end of the cupped rotation shaft is fixedly connected to the rotation shaft of the drive motor.

Optionally, the locating bearing is a double-row bearing.

Optionally, an inner ring of the double-row bearing is in the shape of a truncated cone.

Optionally, a bearing bushing is also provided in the tightening sleeve, wherein the bearing bushing is disposed between the locating bearing and the movable sleeve; one end of the cupped rotation shaft proximal to the drive motor extends into the bearing bushing; and the rotation shaft of the drive motor is disposed in the elbow end cap.

Optionally, an end of the movable sleeve distal from the display module has a first slot, wherein the first slot is arranged along a circumference of the movable sleeve; a central angle of the first slot is an angle of the first slot; a plurality of circumferentially spaced second slots are formed in the elbow end cap; a central angle of any second slot is an angle of the second slot; and a sum of the angle of the first slot and that of the second slot is greater than 180 degrees.

Optionally, the angle of the first slot ranges from 140 degrees to 160 degrees.

Optionally, the angle of the first slot is 150 degrees.

Optionally, the angle of the second slot ranges from 30 degrees to 50 degrees.

Optionally, the angle of the second slot is 40 degrees.

Optionally, the frame segment connected to the rotation part has a mounting hole, wherein the mounting hole extends into the display module; the drive motor is disposed in the mounting hole; and the movable sleeve is fixedly connected to the frame at a periphery of the mounting hole.

Optionally, the mounting hole is disposed at a midpoint in a length direction of the frame segment.

Optionally, the drive motor is a coaxial gear motor.

Optionally, a rotational speed of the coaxial gear motor ranges from 3 rpm to 10 rpm.

Optionally, the first included angle ranges from 40 degrees to 50 degrees.

Optionally, the display module is a double-sided digital signage.

Figure 1:
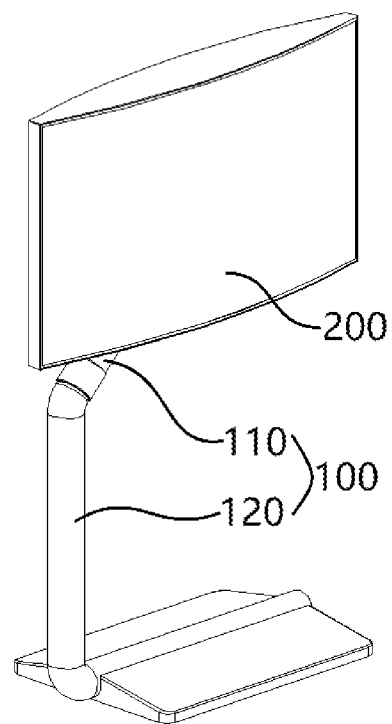
FIG. 1 is a side view of a display apparatus whose display module is in a landscape-screen state according to an embodiment of the present disclosure.

Reference numerals in the figures are as follows:
100—support;
110—rotation part;
111—movable sleeve; 111a—end; 111b—first slot;
112—drive motor; 112a—rotation shaft;
120—support part;
121—support sleeve; 121a—vertical segment; 121b—transition segment; 1211—elbow end cap; 1211a—second slot;
122—base;
130—tightening sleeve; 131—locating bearing; 132—cupped rotation shaft; 133—bearing bushing;
200—display module;
210—frame; 210a—first frame segment; 210b—second frame segment; and
300—electric wire.

DETAILED DESCRIPTION

The following describes the present disclosure in detail. Examples of embodiments of the present disclosure are illustrated in the accompanying drawings. Reference numerals which are the same or similar throughout the accompanying drawings represent the same or similar components or components with the same or similar functions. In addition, if a detailed description of the known technology is unnecessary for the illustrated feature of the present disclosure, it will be omitted. The embodiments described below with reference to the accompanying drawings are examples and are merely used to explain the present disclosure, rather than being construed as limitations to the present disclosure.

Those skilled in the art will appreciate that all terms (including technical and scientific terms) as used herein have the same meanings as commonly understood by those of ordinary skill in the art of the present disclosure, unless otherwise defined. It should be further understood that terms such as those defined in the general dictionary should be understood to have the meanings consistent with the meanings in the context of the prior art, and will not be interpreted in an idealized or overly formal meaning unless specifically defined as herein.

Those skilled in the art will appreciate that the singular forms "a", "an", "the", "said" and "this" may also encompass plural forms, unless otherwise stated. It should be further understood that the expression "include/comprise" used in the description of the present disclosure means there is a feature, an integer, a step, an operation, an element and/or a component, but could not preclude existing or adding of one or more other features, integers, steps, operations, elements, components and/or groups thereof. The expression "and/or" as used herein includes all or any one of one or more of relevant listed items and all combinations thereof.

The technical solution of the present disclosure and how the technical solution of the present disclosure resolves the foregoing technical problem are described in detail below with reference to specific embodiments.

A digital signage that can switch between a landscape-screen state and a portrait-screen state via rotation is more adaptable to content display. In addition, a movable mechanism can attract more attention and gain a better content propagation effect.

Currently, only a single-sided digital signage can switch between the landscape-screen state and the portrait-screen state via rotation, but a double-sided digital signage cannot.

FIG. 1 is a side view of a display apparatus whose display module is in a landscape-screen state according to an embodiment of the present disclosure. Referring to FIG. 1, the display apparatus includes a display module 200 and a support 100 configured to support the display module 200. The support 100 is provided with a support part 120 and a rotation part 110. The support part 120 is disposed on the ground or a platform and supports the display module 200. The rotation part 110 and the support part 120 are pivoted to each other, that is, the rotation part 110 rotates around a rotation axis of the rotation part 110 relative to the support part 120, and a rotation axis of the rotation part 110 is a center line of the rotation part 110. How to implement rotation is not limited in this embodiment, provided that the rotation part 110 can rotate around the center line.

Figure 2:
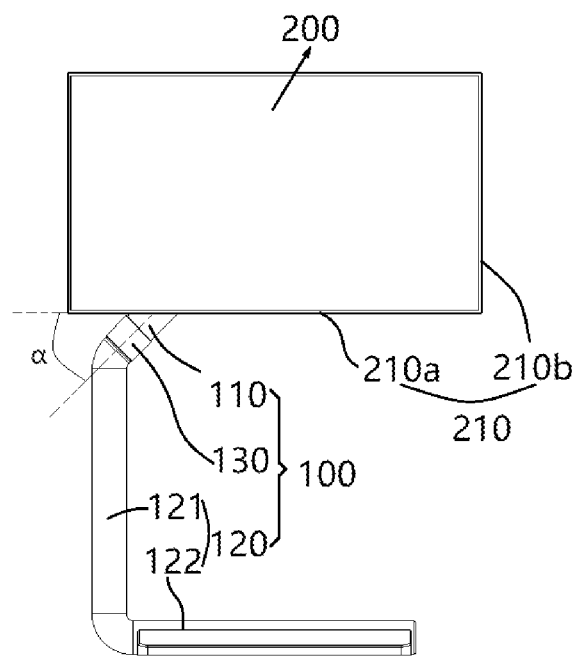
FIG. 2 is a front view of FIG. 1 according to an embodiment of the present disclosure.

FIG. 2 is a front view of FIG. 1 according to an embodiment of the present disclosure. It should be noted that, as shown in FIG. 2, the display module 200 in this embodiment of the present disclosure is a display device. A frame 210 of the display module 200 is an outer frame (the outer frame can be viewed as a part of a housing) of the display device. The outer frame is disposed at a periphery of a display panel, to protect the display panel. The frame 210 includes two oppositely arranged first frame segments 210a and two oppositely arranged second frame segments 210b.

That the entire display module 200 is similar to a cuboid is used as an example for description. Still referring to FIG. 2, the first frame segments 210a are longer frame segments of the display module 20, and the second frame segments 210b are shorter frame segments of the display module 200.

Further, one end of the rotation part 110 distal from the support part 120 is fixedly connected to the frame 210 of the display module 200. The rotation part 110 drives the display module 200 to rotate, thereby implementing switching of the display module 200 between a landscape-screen state and a portrait-screen state. The rotation part 110 may be fixedly connected to one of the first frame segments 210a or one of the second frame segments 210b of the display module 200. For example, the fixed connection may be implemented by using a connector such as a screw.

In FIG. 2, that the rotation part 110 is fixedly connected to the first frame segment 210a is used as an example for description. In order to reduce the range of an angle that needs to be adjusted after the switching of the display module 200 between the landscape-screen state and the portrait-screen state, both the rotation part 110 and the display module 200 are axially symmetric figures. It can be viewed as that an axis of symmetry of the rotation part 110 and that of the display module 200 are basically in a same plane. There is a first included angle (α in FIG. 2) between the rotation axis of the rotation part 110 and the first frame segment 210a of the display module 200. The first included angle can be viewed as an included angle formed when the rotation part 110 and the first frame segment 210a are basically in a same plane. For the first included angle formed when the rotation part 110 is connected to the second frame segment 210b, reference may be made to the condition when the rotation part 110 is connected to the first frame segment 210a. Details are not described again in this embodiment of the present disclosure.

Further, the first included angle α ranges from 40 degrees to 50 degrees inclusive. That the first included angle ranges from 40 degrees to 50 degrees can ensure that the switching between the landscape-screen state and the portrait-screen state is realized after rotation (for example, the switching fails when the first included angle is 90 degrees), and can further ensure that the screen is basically in a landscape state or a portrait state after the switching (if the included angle is too large or too small, the display module is in a large-deviation state after the rotation). Therefore, basic display requirements can be met without extra adjustment.

In addition, that the display module 200 is in the landscape-screen state means that the first frame segments 210a of the display module 200 are horizontal or approximately horizontal (as shown in FIGS. 1 and 2).

Figure 3:
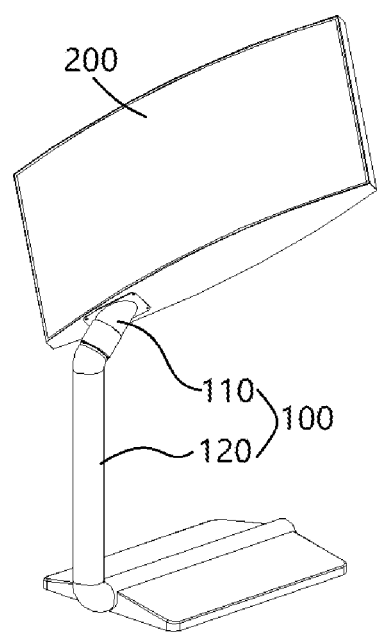
FIG. 3 is a side view of a display apparatus whose display module is in an intermediate state according to an embodiment of the present disclosure, wherein the intermediate state is between a landscape-screen state and a portrait-screen state.

FIG. 3 is a side view of a display apparatus whose display module is in an intermediate state according to an embodiment of the present disclosure, wherein the intermediate state is between a landscape-screen state and a portrait-screen state. Referring to FIG. 3, when the landscape-screen state of the display module 200 is adjusted, the display module 200 is in the intermediate state between a horizontal state and a vertical state.

Figure 4:
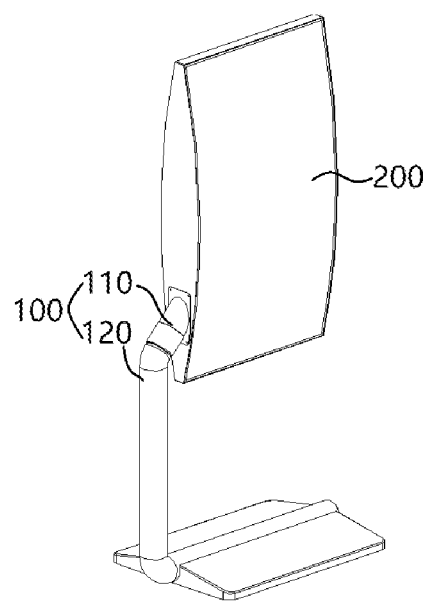
FIG. 4 is a side view of a display apparatus whose display module is in a portrait-screen state according to an embodiment of the present disclosure.
Figure 5:
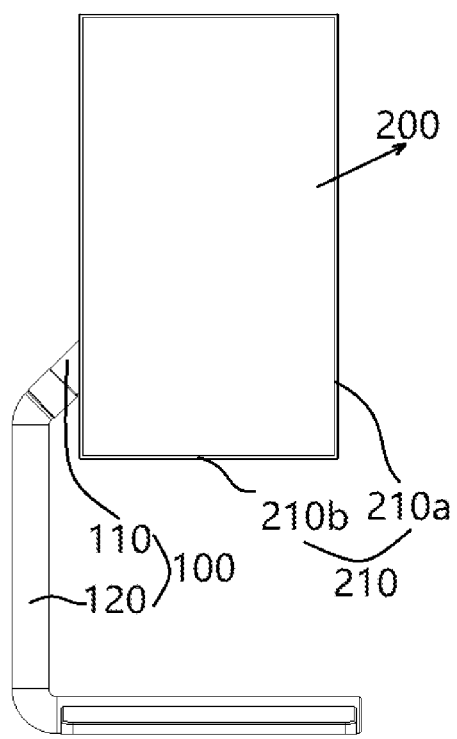
FIG. 5 is a front view of FIG. 4 according to an embodiment of the present disclosure.

FIG. 4 is a side view of a display apparatus whose display module is in a portrait-screen state according to an embodiment of the present disclosure. FIG. 5 is a front view of FIG. 4 according to an embodiment of the present disclosure. Referring to FIGS. 4 and 5, that the display module 200 is in the portrait-screen state means that the second frame segments 210b of the display module 200 are horizontal or approximately horizontal.

In this embodiment of the present disclosure, a support 100 of the display apparatus has a rotation part 110 and a support part 120 that can rotate relatively. A central axis of the rotation part 110 is at a first included angle with a frame 210 of the display module 200. The first included angle is controlled within a certain range, so that the rotation part 110 can drive the display module 200 to rotate, and switching between a landscape-screen state and a portrait-screen state can be implemented according to a display requirement. In addition, the display module 200 has almost no deviation after the switching, and a normal display requirement can be met without extra adjustment. Because the rotation part is fixedly connected to the frame of the display module, without impacting normal display of the display module, switching of a double-sided display module between a landscape-screen state and a portrait-screen state can be implemented. In addition, a structure is simple, and mounting and maintenance are easy.

Optionally, an inventor of the present disclosure discovers via research that, as shown in FIG. 2, when the first included angle α between the axis of the rotation part 110 and the first frame segment 210a of the display module 200 is 45 degrees, the rotation part 110 just rotates by 180 degrees, and the switching of the display module 200 between the landscape-screen state and the portrait-screen state can be realized. In addition, after the switching, the screen of the display module 200 can be kept in a horizontal state (corresponding to the landscape-screen state) or a vertical state (corresponding to the portrait-screen state), without extra adjustment of the screen.

For example, it is assumed that the display module 200 is in the horizontal state which is the initial state. After rotating along with the rotation part 110 by 180 degrees, the display module 200 is just switched to the vertical state. Similarly, it is assumed that the display module 200 is in the vertical state which is the initial state. After rotating along with the rotation part 110 by 180 degrees, the display module 200 is just switched to the horizontal state.

In this embodiment of the present disclosure, the first included angle α between the axis of the rotation part 110 and the frame 210 of the display module 200 is restricted to 45 degrees, so that the display module 200 can switch between the landscape-screen state and the portrait-screen state under the driving of the rotation part 110. In addition, the screen has no deviation after the switching, thereby improving a display effect of the display apparatus.

Figure 6:
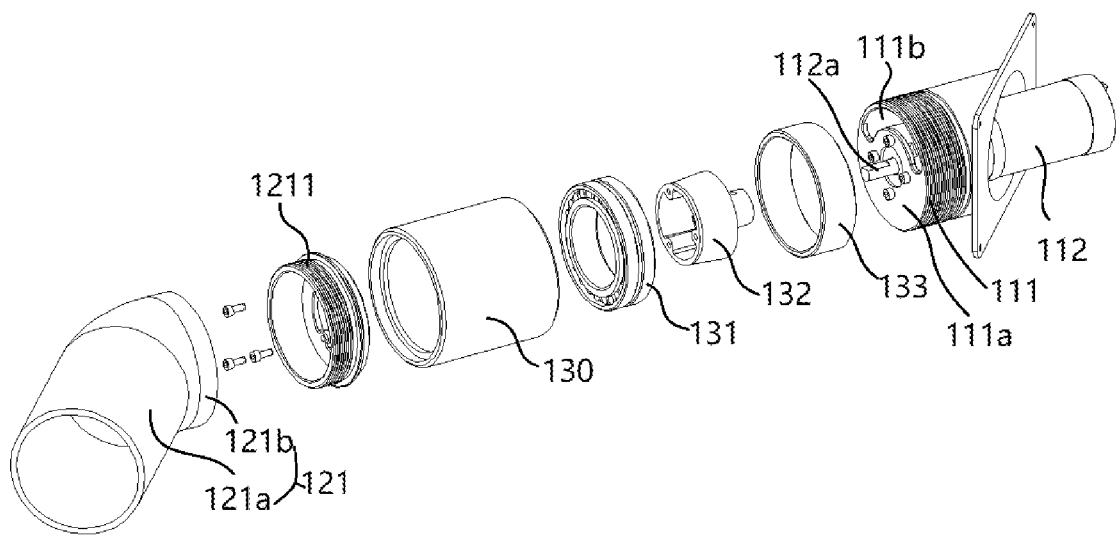
FIG. 6 is an exploded diagram of a rotation part and a support part of a display apparatus according to an embodiment of the present disclosure.
Figure 7:
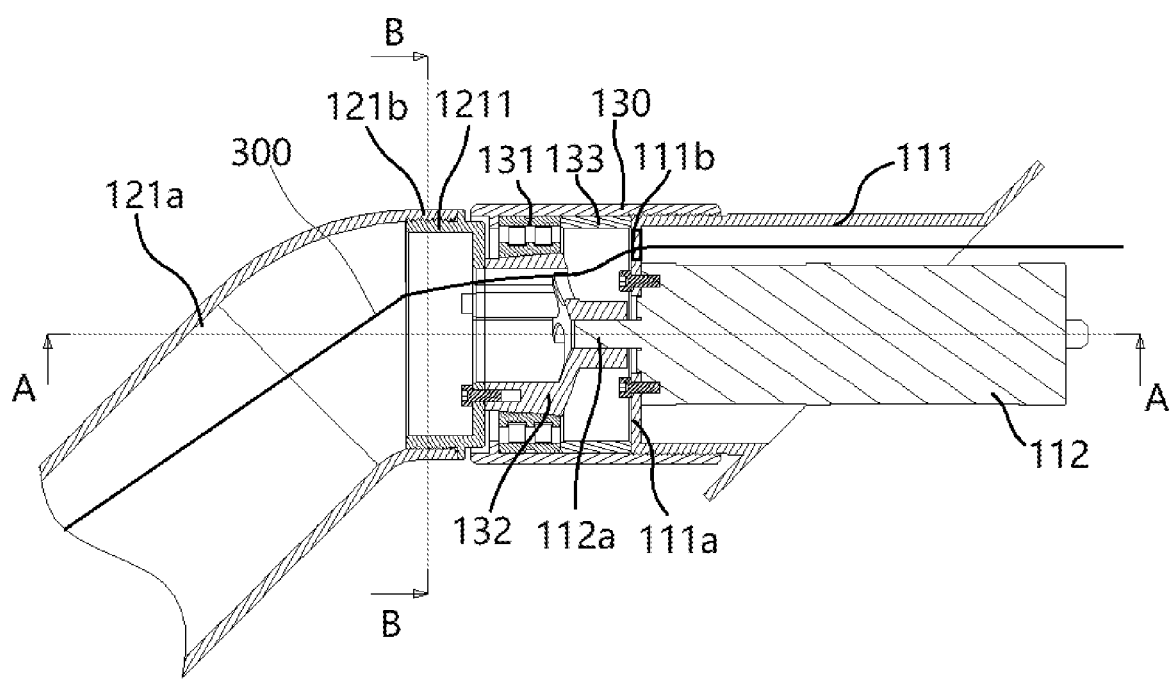
FIG. 7 is a schematic diagram of internal structures of a rotation part and a support part of a display apparatus according to an embodiment of the present disclosure.
Figure 8:
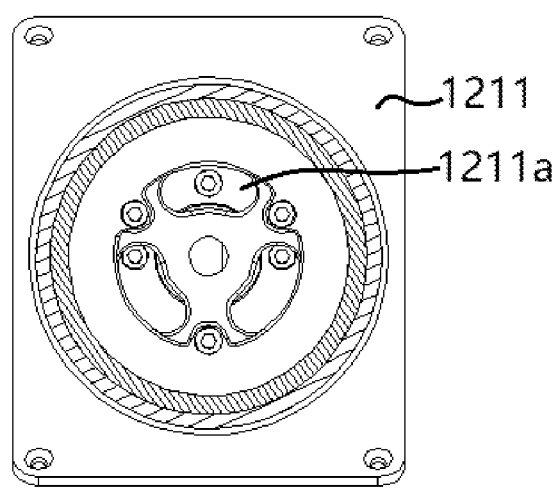
FIG. 8 is a schematic sectional view of B-B in FIG. 7 according to an embodiment of the present disclosure.
Figure 9:
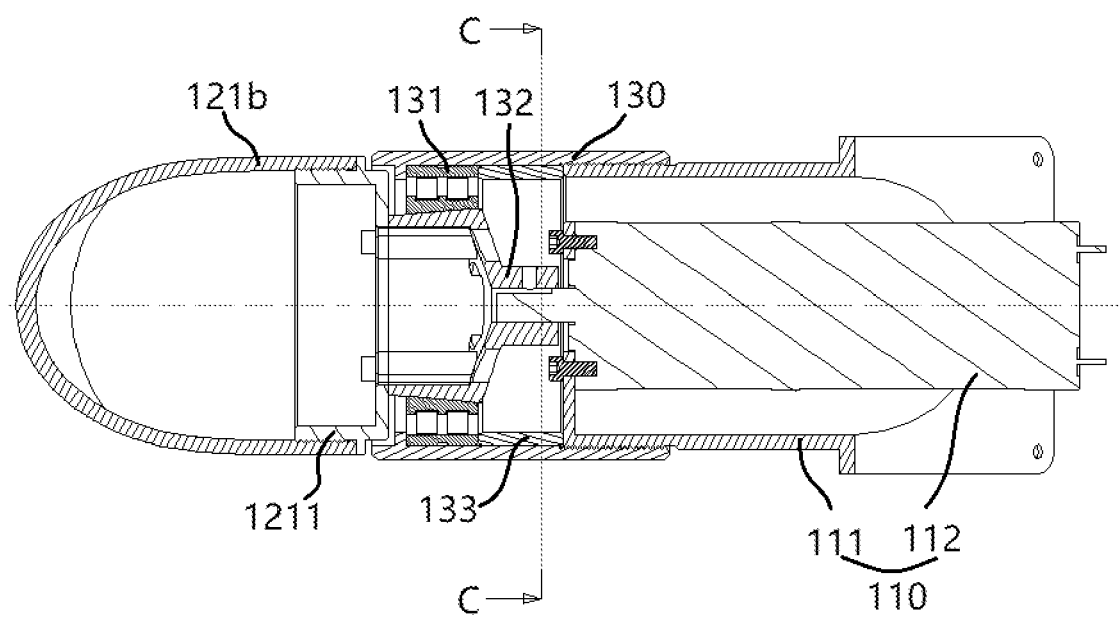
FIG. 9 is a schematic sectional view of A-A in FIG. 7 according to an embodiment of the present disclosure.

Optionally, the embodiments of the present disclosure provide the following possible implementation for the support part 120 and the rotation part 110:

FIG. 6 is an exploded diagram of a rotation part and a support part of a display apparatus according to an embodiment of the present disclosure. FIG. 7 is a schematic diagram of internal structures of a rotation part and a support part of a display apparatus according to an embodiment of the present disclosure. FIG. 8 is a schematic sectional view of B-B in FIG. 7 according to an embodiment of the present disclosure. FIG. 9 is a schematic sectional view of A-A in FIG. 7 according to an embodiment of the present disclosure. With reference to FIGS. 2, 6, 7 and 9, the support part 120 in the embodiments of the present disclosure includes a base 122 and a support sleeve 121. One end of the support sleeve 121 is fixedly connected to the base 122. The rotation part 110 includes a movable sleeve 111. One end of the movable sleeve 111 is pivoted to one end of the support sleeve 121 distal from the base 122. The other end of the movable sleeve 111 is fixedly connected to the frame 210 of the display module 200. The base 122 may be in the shape of a plate or a platform, and may be made of a high-density material, so that the entire support part 120 is structurally stabler, and the display module 200 can be prevented from turning to one side.

For example, referring to FIG. 7, both the support sleeve 121 and the movable sleeve 111 have hollow structures. An electric wire 300 (including circuits such as a power cord and a signal line) used for normal display of the display module 200 may penetrate through the support sleeve 121 and the movable sleeve 111. In addition, corresponding locating parts and transmission parts may be arranged in the support sleeve 121 and the movable sleeve 111. An implementation of pivoting the support sleeve 121 to the movable sleeve 111 is not specifically limited in this embodiment of the present disclosure, provided that the movable sleeve 111 can rotate freely relative to the support sleeve 121.

Optionally, still referring to FIGS. 6 and 7, the support sleeve 121 in the embodiments of the present disclosure includes a vertical segment 121a and a transition segment 121b. The vertical segment 121a is perpendicularly connected to the base 122. For example, the connection may be bolted connection, welding, or clamping. An axis of the transition segment 121b is at a second included angle with an axis of the vertical segment 121a. A sum of the second included angle and the first included angle is 180 degrees, that is, the second included angle ranges from 130 degrees to 140 degrees. The vertical segment 121a supports the display module 200, so that the display module 200 is above a plane where a bottom surface of the base 122 is disposed, and a space is reserved for rotary switching between the landscape-screen state and the portrait-screen state.

Further, a smooth transitional connection may be adopted between the transition segment 121b and the vertical segment 121a. The smooth transitional connection part may have a structure similar to an arc-shaped sleeve, thereby forming an elbow part of the support sleeve 121. The structure of the smooth transitional connection part can improve structural strength of the entire support sleeve 121. The transition segment 121b, the vertical segment 121a and the base 122 form the entire support part 120. The transition segment 121b is pivoted to the movable sleeve 111, that is, the movable sleeve 111 can rotate relative to the transition segment 121b. The movable sleeve 111 drives the display module 200 to rotate, thereby implementing the switching of the display module 200 between the landscape-screen state and the portrait-screen state.

Optionally, the embodiments of the present disclosure provide the following possible implementation for relative rotation between the movable sleeve 111 and the transition segment 121b of the support sleeve 121:

Still referring to FIGS. 6, 7 and 9, a drive motor 112 is provided in the movable sleeve 111. A rotation shaft of the drive motor 112 is fixedly connected to the transition segment 121b. A housing of the drive motor 112 is coaxial with the movable sleeve 111, which facilitates their synchronous rotation. An annular space is provided between the housing of the drive motor 112 and an inside wall of the movable sleeve 111. Due to the annular space, interference can be avoided during relative rotation between the drive motor 112 and the movable sleeve 111, and arrangement of the electric wire 300 is facilitated.

Further, the housing (a part rotating relative to the rotation shaft 112a) of the drive motor 112 is fixedly connected to one end of the movable sleeve 111 (for example, via bolted connection), so that the movable sleeve 111 rotates along with the housing of the drive motor 112.

In order to implement relative rotation between the transition segment 121b and the movable sleeve 111, an elbow end cap 1211 is provided in the transition segment 121b of the support sleeve 121. The elbow end cap 1211 is fixedly connected to an inside wall of the transition segment 121b (for example, via threaded connection). An end 111a of the movable sleeve 111 has a slot through which the rotation shaft 112a of the drive motor 112 penetrates. The rotation shaft 112a of the drive motor 112 extends out of the slot, and is fixedly connected to the elbow end cap 1211.

When the rotation shaft 112a of the drive motor 112 works, because the rotation shaft 112a is connected to the elbow end cap 1211, it can be viewed that the rotation shaft 112a is connected to the entire support part 120, the rotation shaft 112a can be viewed as relatively still, and the housing of the drive motor 112 rotates relative to the rotation shaft 112a, thereby driving the movable sleeve 111 connected to the housing of the drive motor 112 to rotate, and further implementing the switching of the display module 200 between the landscape-screen state and the portrait-screen state.

In the embodiments of the present disclosure, a single drive motor 112 is used to drive the movable sleeve 111 to rotate relative to the support sleeve 121. Therefore, the switching of the display module 200 between the landscape-screen state and the portrait-screen state can be implemented. In addition, a structure is simple, and mounting and maintenance are easy.

Optionally, the drive motor 112 may be a coaxial gear motor. The coaxial gear motor can rotate synchronously with the movable sleeve 111. In addition, a rotational speed is slow and easy to control.

Optionally, the rotational speed of the drive motor 112 ranges from 3 rpm to 10 rpm inclusive. That the rotational speed of the drive motor 112 is controlled within 3 rpm to 10 rpm can guarantee safety of the display module 200 and ensure that a rotational posture of the display module 200 is easy to control.

In some embodiments, still referring to FIGS. 7 and 9, in addition to the base 122 and the support sleeve 121, the support part 120 in the embodiments of the present disclosure further includes a tightening sleeve 130. One end of the tightening sleeve 130 may be oppositely connected the transition segment 121b via the elbow end cap 1211. The other end of the tightening sleeve 130 is sleeved on an outside of the movable sleeve 111, that is, one end of the movable sleeve 111 distal from display module 200 is embedded in the tightening sleeve 130.

Further, a locating bearing 131 and a cupped rotation shaft 132 are provided in the tightening sleeve 130. The cupped rotation shaft 132 is fitted with an inner ring of the locating bearing 131. One end of cupped rotation shaft 132 may be fixedly connected to the elbow end cap 1211 via a bolt. The other end of the cupped rotation shaft 132 is fixedly connected to the rotation shaft 112a of the drive motor 112.

Optionally, the locating bearing 131 may be a double-row bearing. An inner ring of the double-row bearing has a truncated cone-shaped structure. A diameter at one end of the truncated cone-shaped structure proximal to the drive motor 112 is greater than that at one end of the truncated cone-shaped structure distal from the drive motor 112. An appearance of the cupped rotation shaft 132 also has a truncated cone-shaped structure, to be fitted with the inner ring of the double-row bearing better. A through hole is axially formed in the cupped rotation shaft 132. The through hole is used for penetration of the electric wire 300 and reducing weight of the cupped rotation shaft 132. Support and axial locating of the cupped rotation shaft 132 can be realized by using the locating bearing 131, thereby enhancing strength of a connection between the rotation part 110 and the support part 120, and stably supporting the display module 200.

In some embodiments, still referring to FIGS. 7 and 9, in order to space the drive motor 112 axially, in addition to the locating bearing 131 and the cupped rotation shaft 132, the tightening sleeve 130 in the embodiments of the present disclosure further has a bearing bushing 133 inside. The bearing bushing 133 is disposed between the locating bearing 131 and the end 111a of the movable sleeve 111. One end of the bearing bushing 133 abuts on an outer ring of the locating bearing 131. The other end of the locating bearing 131 abuts to a wall of the movable sleeve 111.

Further, one end of the cupped rotation shaft 132 proximal to the drive motor 112 extends into the bearing bushing 133. In addition, the rotation shaft 112a of the drive motor 112 is disposed in the elbow end cap 1211, that is, the cupped rotation shaft 132 and the rotation shaft 112a of the drive motor 112 are fixedly connected to each other in the bearing bushing 133.

Figure 10:
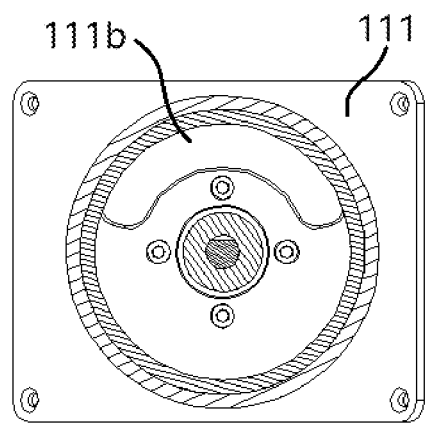
FIG. 10 is a schematic sectional view of C-C in FIG. 9 according to an embodiment of the present disclosure.

In some embodiments, the inventor of the present disclosure considers that, as shown in FIG. 7, the switching of the display module 200 between the landscape-screen state and the portrait-screen state in a bracket requires 180-degrees rotation of the movable sleeve 111 relative to the tightening sleeve 130. Because the electric wire 300 is provided in the movable sleeve 111, the tightening sleeve 130 and the support sleeve 121, the electric wire 300 has high possibilities of twist and damage if the movable sleeve 111 rotates back and forth for a long time. Based on this, the embodiments of the present disclosure provide the following possible implementation for structures of the movable sleeve 111 and the elbow end cap 1211:

FIG. 10 is a schematic sectional view of C-C in FIG. 9 according to an embodiment of the present disclosure. As shown in FIGS. 6, 9 and 10, an end of the movable sleeve 111 distal from the display module 200 has a first slot 111b. The first slot 111b is arranged along a circumference of the movable sleeve 111. The first slot 111b is disposed at the end 111a of the movable sleeve 111 and proximal to a wall of the movable sleeve, and corresponds to preset clearances in the housing of the drive motor 112 and in a bracket on an inside wall of the movable sleeve 111, thereby facilitating mounting of the electric wire 300, without impacting mounting of the drive motor 112.

As shown in FIGS. 7 and 8, a plurality of circumferentially spaced second slots 1211a are formed in an end of the elbow end cap 1211. A corresponding electric wire 300 can be arranged in each second slot 1211a according to actual needs Example wiring of the electric wire 300 is shown in FIG. 7. The electric wire 300 is first led out of the display module 200, enters the movable sleeve 111, then passes through a clearance area between the movable sleeve 111 and the drive motor 112 together with a circuit of the drive motor 112, penetrates through the first slot 111b, enters the bearing bushing 133, penetrates through a cavity in the cupped rotation shaft 132 and the second slots 1211a, enters the support sleeve 121, and is finally led out of the base 122 and electrically connected to an external apparatus.

Further, a central angle of the first slot 111b is an angle of the first slot 111b. A central angle of any second slot 1211a is an angle of the second slot 1211a. A sum of the angle of the first slot 111b and that of the second slot 1211a is greater than 180 degrees, that is, when the movable sleeve 111 rotates relative to the elbow end cap 1211 by 180 degrees, the first slot 111b and the second slot 1211a are still partially overlapped, which avoids damage to the electric wire 300.

It should be noted that, the angle of the first slot 111b is a range of a central angle covered by the first slot 111b and is calculated by taking an axis of the movable sleeve 111 as a center; and the angle of the second slot 1211a is a range of a central angle covered by the second slot 1211a and is calculated by taking an axis of the elbow end cap 1211 as a center.

In this embodiment of the present disclosure, the first slot 111b is formed in the movable sleeve 111, the second slot 1211a is formed in the support sleeve 121, and the sum of the angle of the first slot 111b and that of the second slot 1211a is greater than 180 degrees. Therefore, damage to the electric wire 300 in the display module 200 can be avoided during the switching between the landscape-screen state and the portrait-screen state, thereby prolonging a service life of the entire display apparatus.

Optionally, in this embodiment of the present disclosure, the angle of the first slot 111b ranges from 140 degrees to 160 degrees inclusive. The angle of the first slot 111b is limited to 140 degrees to 160 degrees, which enlarges the angle of the slot as much as possible on the premise that structural strength is guaranteed, and prevents the electric wire 300 from being worn during rotation of the movable sleeve 111.

Optionally, there may be three second slots 1211a. An angle of each second slot 1211a ranges from 30 degrees to 50 degrees inclusive. The angle of the second slot 1211a is limited to 30 degrees to 50 degrees, which enlarges the angle of the slot as much as possible on the premise that structural strength is guaranteed, and prevents the electric wire 300 from being worn during rotation of the elbow end cap 1211 relative to the movable sleeve 111.

Optionally, the angle of the first slot 111b may be 150 degrees. Accordingly, the angle of the second slot 1211a may be 40 degrees.

In some embodiments, still referring to FIGS. 2 and 5, a connection location between the movable sleeve 111 and the display module 200 may be in the first frame segment 210a or the second frame segment 210b. Based on the connection location between the movable sleeve 111 and the frame 210 of the display module 200, the first frame segment 210a has a mounting hole (not shown in the figure). The mounting hole extends into the display module 200. The drive motor 112 in the movable sleeve 111 is fitted with the mounting hole, so that the drive motor 112 extends along the mounting hole into the display module 200, and the drive motor 112 is prevented from interfering with a device in the display module 200.

It may be understood that, if the movable sleeve 111 is fixedly connected to the first frame segment 210a, the mounting hole is formed in the first frame segment 210a; if the movable sleeve 111 is fixedly connected to the second frame segment 210b, the mounting hole is formed in the second frame segment 210b.

In some embodiments, to improve structural stability of the support 100, the movable sleeve 111 and the frame 210 of the display module 200 may be connected at a midpoint of the first frame segment 210a or the second frame segment 210b. Accordingly, the mounting hole is disposed at a midpoint in a length direction of the first frame segment 210a or the second frame segment 210b.

In this embodiment, the rotation part 110 of the support 100 is connected to the midpoint of the first frame segment 210a or the second frame segment 210b that is connected to the display module 200, so that force born by the display module 200 and the movable sleeve 111 is distributed more uniformly, and the support 100 supports the display module 200 more stably.

Optionally, the display module 200 in the embodiments of the present disclosure is a double-sided digital signage. The double-sided digital signage has two display panels. To-be-displayed content (for example, an advertising slogan or a pattern) can be displayed on both sides of the double-sided digital signage. The display panels of the double-sided digital signage may be liquid crystal displays (LCD) or organic light-emitting diodes (OLED).

In this embodiment of the present disclosure, the rotation part 110 that can rotate relative to the support part 120 is connected to the double-sided digital signage, thereby driving the double-sided digital signage to rotate, and further implementing switching of the double-sided digital signage between a landscape-screen state and a portrait-screen state.

In addition, the display apparatus is innovative in structural design, simple in structure, and easy to mount and maintain.

Each embodiment of the present disclosure at least has the following technical effects:

1. A support of the display apparatus has a rotation part and a support part that can rotate relatively. An axis of the rotation part is at a first included angle with a frame of a display module. The first included angle is controlled within a certain range, so that the rotation part can drive the display module to rotate, and switching between a landscape-screen state and a portrait-screen state can be implemented according to a display requirement. In addition, the display module has almost no deviation after the switching, and a normal display requirement can be met. Because the rotation part is fixedly connected to the frame of the display module, without impacting normal display of the display module, switching of a double-sided display module between a landscape-screen state and a portrait-screen state can be implemented. In addition, a structure is simple, and mounting and maintenance are easy.

2. The included angle between the axis of the rotation part and the frame of the display module is restricted to 45 degrees, so that the display module can switch between the landscape-screen state and the portrait-screen state under the driving of the rotation part. In addition, the screen has no deviation after the switching, thereby improving a display effect of the display apparatus.

3. Support and axial locating of the cupped rotation shaft can be realized by using the locating bearing, thereby enhancing strength of a connection between the rotation part and the support part, and stably supporting the display module.

4. A first slot is formed in a movable sleeve, a second slot is formed in a support sleeve, and a sum of an angle of the first slot and that of the second slot is greater than 180 degrees. Therefore, damage to an electric wire in the display module can be avoided during the switching between the switching between the landscape-screen state and the portrait-screen state, thereby prolonging a service life of the entire display apparatus.

5. The rotation part of the support is connected to a midpoint of a first frame segment or a second frame segment that is connected to the display module, so that force born by the display module and the movable sleeve is distributed more uniformly, and the support supports the display module more stably.

6. The rotation part that can rotate relative to the support part is connected to a double-sided digital signage, thereby driving the double-sided digital signage to rotate, and further implementing switching of the double-sided digital signage between a landscape-screen state and a portrait-screen state. In addition, the display apparatus is innovative in structural design, simple in structure, and easy to mount and maintain.

In the description of the present invention, it should be understood that the orientation or position relations indicated via terms of "central", "upper", "lower", "front", "rear", "left", "right", "vertical" "horizontal", "top", "bottom", "inner", "outer", and the like are based on orientation or the position relations shown in the drawings, only to describe the present disclosure conveniently and simplify the description, but not indicate or imply that referred apparatuses or elements must have particular orientations or be constructed and operated with the particular orientation, so that they cannot be construed as restrictions on the present disclosure.

The terms "first" and "second" are only for the purpose of description and should not be construed as indicating or implying relative importance or implicitly indicating the number of technical features indicated. Thus, the features defined by the terms "first" and "second" may include one or more of the features either explicitly or implicitly. In the description of the present disclosure, unless otherwise stated, the term "a plurality of" means two or more.

In the description of the present disclosure, it should be noted that, unless otherwise definitely specified and limited, the terms "mounted', "connected to each other', and "connected to' need to be broadly understood, for example, connection may be fixed connection, or detachable connection or integrated connection; or may be direct connection, or indirect connection via an intermediation, or communication of inner parts of two elements. A person of ordinary skill in the art can understand the specific meaning of the above terms in the present disclosure in accordance with specific conditions.

In this specification, the specific feature, structure, material and characteristic described may be combined in an appropriate manner in any one or more embodiments or examples.

The foregoing descriptions are merely some implementations of the present disclosure. It should be noted that those of ordinary skill in the art may further make several improvements and refinements without departing from the principle of the present disclosure, and these improvements and refinements shall fall within the protection scope of the present disclosure.

What is claimed is:

1. A display apparatus, comprising a support and a display module; wherein a frame is disposed at a periphery of the display module, and comprises two first frame segments which are oppositely arranged and two second frame segments which are oppositely arranged;

the support comprises a support part and a rotation part, wherein one end of the rotation part is pivoted to the support part, a rotation axis of the rotation part is a center line of the rotation part, and the other end of the rotation part is fixedly connected to any one of the first frame segments and the second frame segments;

the axis of the rotation part is at a first included angle with a frame segment connected to the rotation part, and the first included angle is used for switching of the display module between a landscape-screen mode and a portrait-screen mode;

the support part comprises a base and a support sleeve, and one end of the support sleeve is fixedly connected to the base; and the rotation part comprises a movable sleeve, wherein one end of the movable sleeve is pivoted to the other end of the support sleeve, and the other end of the movable sleeve is fixedly connected to the frame of the display module;

wherein the support sleeve comprises a vertical segment and a transition segment; the vertical segment is perpendicularly connected to the base, the transition segment is fixedly connected to the vertical segment and pivoted to the movable sleeve, an axis of the transition segment is at a second included angle with an axis of the vertical segment, and a sum of the second included angle and the first included angle is 180 degrees.

2. The display apparatus according to claim 1, wherein a drive motor is provided in the movable sleeve, a rotation shaft of the drive motor is fixedly connected to the transition segment, a housing of the drive motor is coaxial with the movable sleeve, an annular space is provided between the housing of the drive motor and the movable sleeve, and the housing of the drive motor is fixedly connected to one end of the movable sleeve.

3. The display apparatus according to claim 2, wherein an elbow end cap is provided in the transition segment of the support sleeve, the elbow end cap is fixedly connected to an inside wall of the transition segment, and the rotation shaft of the drive motor penetrates through the end of the movable sleeve and is fixedly connected to the elbow end cap.

4. The display apparatus according to claim 3, wherein the support part further comprises a tightening sleeve, one end of the tightening sleeve is oppositely connected the transition segment, and the other end of the tightening sleeve is sleeved on an outside of the movable sleeve; and a locating bearing and a cupped rotation shaft are provided in the tightening sleeve; the cupped rotation shaft is fitted with an inner ring of the locating bearing; one end of the cupped rotation shaft is fixedly connected to the elbow end cap; and the other end of the cupped rotation shaft is fixedly connected to the rotation shaft of the drive motor.

5. The display apparatus according to claim 4, wherein the locating bearing is a double-row bearing.

6. The display apparatus according to claim 5, wherein an inner ring of the double-row bearing is in a shape of a truncated cone.

7. The display apparatus according to claim 4, wherein a bearing bushing is also provided in the tightening sleeve; and the bearing bushing is between the locating bearing and the movable sleeve; and one end of the cupped rotation shaft proximal to the drive motor extends into the bearing bushing, and the rotation shaft of the drive motor is in the elbow end cap.

8. The display apparatus according to claim 7, wherein an end of the movable sleeve distal from the display module has a first slot, the first slot is arranged along a circumference of the movable sleeve, and a central angle of the first slot is an angle of the first slot;

a plurality of circumferentially spaced second slots are formed in the elbow end cap; and a central angle of any second slot is an angle of the second slot; and a sum of the angle of the first slot and the angle of the second slot is greater than 180 degrees.

9. The display apparatus according to claim 8, wherein the angle of the first slot ranges from 140 degrees to 160 degrees.

10. The display apparatus according to claim 8, wherein the angle of the first slot is 150 degrees.

11. The display apparatus according to claim 8, wherein an angle of each of the second slots ranges from 30 degrees to 50 degrees.

12. The display apparatus according to claim 11, wherein the angle of each of the second slots is 40 degrees.

13. The display apparatus according to claim 2, wherein the frame segment connected to the rotation part has a mounting hole, the mounting hole extends into the display module, the drive motor is disposed in the mounting hole, and the movable sleeve is fixedly connected to the frame at a periphery of the mounting hole.

14. The display apparatus according to claim 13, wherein the mounting hole is disposed at a midpoint in a length direction of the frame segment.

15. The display apparatus according to claim 2, wherein the drive motor is a coaxial gear motor.

16. The display apparatus according to claim 15, wherein a rotational speed of the coaxial gear motor ranges from 3 rpm to 10 rpm.

17. The display apparatus according to claim 1, wherein the first included angle ranges from 40 degrees to 50 degrees.

18. The display apparatus according to claim 1, wherein the display module is a doublesided digital signage.

\* \* \* \* \*